United States Patent [19]

Saruwatari

[11] Patent Number: 5,319,595
[45] Date of Patent: Jun. 7, 1994

[54] SEMICONDUCTOR MEMORY DEVICE WITH SPLIT READ DATA BUS SYSTEM

[75] Inventor: Yasuhiro Saruwatari, Tokyo, Japan

[73] Assignee: NEC Corporation, Tokyo, Japan

[21] Appl. No.: 958,794

[22] Filed: Oct. 9, 1992

[30] Foreign Application Priority Data

Oct. 9, 1991 [JP] Japan .................................. 3-261557

[51] Int. Cl.$^5$ ............................................. G11C 13/00
[52] U.S. Cl. ........................ 365/189.01; 365/230.03; 365/63
[58] Field of Search ...................... 365/189.01, 230.03, 365/63

[56] References Cited

U.S. PATENT DOCUMENTS

| 4,554,646 | 11/1985 | Yoshimoto et al. | 365/174 |
| 4,935,901 | 6/1990 | Sasaki et al. | 360/230.03 |
| 5,172,335 | 12/1992 | Sasaki et al. | 365/63 |

Primary Examiner—Eugene R. LaRoche
Assistant Examiner—F. Niranjan
Attorney, Agent, or Firm—Sughrue, Mion, Zinn, Macpeak & Seas

[57] ABSTRACT

Accessed data bits are developed by a sense amplifier unit for driving one of data bus sub-systems associated with a part of a memory cell array, and a data line selecting unit causes output data circuits to be responsive to the accessed data bits on the selected data bus subsystem only, whereby the sense amplifier unit allows the accessed data bits to be propagated at high speed because of reduction of parasitic capacitance.

2 Claims, 3 Drawing Sheets

SEMICONDUCTOR MEMORY DEVICE WITH SPLIT READ DATA BUS SYSTEM

FIELD OF THE INVENTION

This invention relates to a semiconductor memory device and, more particularly, to a read data bus system incorporated in the semiconductor memory device.

DESCRIPTION OF THE RELATED ART

A typical example of the semiconductor memory device is illustrated in FIG. 1, and is fabricated on a rectangular semiconductor chip 1. The rectangular semiconductor chip 1 has lateral edges 1a and 1b longer than side edges 1c and 1d, and the semiconductor memory device 1 largely comprises a memory cell array 2, an addressing unit and a data transfer unit. The memory cell array 2 is constituted by a plurality columns of memory cells, and digit lines BIT are associated with the columns of memory cells for propagating data bits read out therefrom. Every four columns of memory cells form in combination a memory cell block BL, and the memory cell blocks BL are divided into two groups.

The data transfer unit has two sense amplifier circuit arrays 3a and 3b, and the sense amplifier circuits are respectively associated with the columns of memory cells so that logic levels of data bits on the digit lines BIT are quickly discriminated by the sense amplifier circuits. Every four sense amplifier circuits form a sense amplifier circuit group, and every sense amplifier circuit group is associated with one of the memory cell blocks BL. The data transfer unit further has a read data bus system 4 consisting of four read-out data lines 4a, 4b, 4c and 4d, and the read data bus system 4 is shared between the sense amplifier circuit groups.

The addressing unit has a row address decoder circuit 3, and the address decoder circuit 3 is located in the central area of a rectangular section occupied by the memory cell array 1. The row address decoder circuit 3 is responsive to row address bits, and memory cells are selected from the individual columns of the memory cells, respectively. Data bits are transferred between the selected memory cells and the digit lines BIT, and the data bits are selectively propagated to the sense amplifier arrays 3a and 3b in a read-out cycle. Though not shown in FIG. 1, a column selector circuit associated with a column address decoder circuit is coupled between the memory cell blocks BL and the sense amplifier circuits 3a and 3b, and only one of the sense amplifier circuit groups is coupled with the associated memory cell block BL through digit lines BIT.

The four read-out data lines 4a to 4d extend in parallel to the lateral edges 1a and 1b, and are coupled with four output circuits 5a, 5b, 5c and 5d. The output circuits 5a to 5d are respectively associated with four output data pins 6a, 6b, 6c and 6d, and a four-bit output data signal is supplied to the outside of the semiconductor memory device. The four output circuits 5a to 5d are similar in circuit arrangement to one another, and are concurrently enabled with an output enable signal OE. Each of the output circuits 5a to 5d comprises three inverters IN1, IN2 and IN3, a NOR gate NR1, a NAND gate ND1 and an output driver IN4 implemented by a series combination of a p-channel enhancement type switching transistor QP1 and an n-channel enhancement type switching transistor QN2. The output driver IN4 is coupled between a power voltage source Vdd and a ground voltage line, and the associated data pin 6a, 6b, 6c or 6d is coupled with the common drain node of the p-channel enhancement type switching transistor QP1 and the n-channel enhancement type switching transistor QN2.

The prior art semiconductor memory device thus arranged behaves as follows. If the row address decoder circuit 3 selects a row of the memory cells from the memory cell array 2, data bits are read out from the selected memory cells to the associated digit lines BIT, and the column selector unit transfers four read-out data bits to the associated sense amplifier circuits of the array 3a or 3b. The sense amplifier circuits discriminate the logic levels of the read-out data bits, and drive the read-out data lines 4a to 4d, respectively. The, read-out data lines 4a to 4d propagate the four read-out data bits to the output circuits 5a to 5d. When the output enable signal OE goes down to the active low voltage level, the NOR gates NR1 and the NAND gates ND1 are respectively enabled with the output enable signal OE and the complementary signal thereof, and each of the read-out data bits causes the associated NOR gate NR1 and the associated NAND gate ND1 to produce output signals complementary to each other. The output signals are inverted in logic level at the inverters IN2 and IN3, and cause the p-channel enhancement type switching transistor QP1 and the n-channel enhancement type switching transistor QN2 to complementarily turn on and off, thereby driving the associated output data pin.

A problem is encountered in the prior art semiconductor memory device in the access speed. In detail, the semiconductor memory device is expected to store more data bits, and the number of the memory cell blocks BL is continuously increased. The memory cell blocks BL laterally extend, and the read-out data lines 4a to 4d are prolonged together with the memory cell blocks BL, because the read-out data lines 4a to 4d extend along the sense amplifier circuit arrays 3a and 3b. The longer read-out data lines 4a to 4d, the larger amount of parasitic capacitance coupled therewith. As a result, the data access speed is deteriorated with the integration density of the memory cells.

SUMMARY OF THE INVENTION

It is therefore an important object of the present invention to provide a semiconductor memory device which allows an external device to access data bits at high speed.

To accomplish the object, the present invention proposes to divide read-out data lines into sections isolated from one another.

In accordance with the present invention, there is provided a semiconductor memory device fabricated on a semiconductor chip, comprising: a) a memory cell array having a plurality of memory cells arranged in rows and columns, and storing data bits in the plurality of memory cells, respectively; b) a data bus system grouped into a plurality of data bus sub-systems electrically isolated from one another; c) a sense amplifier unit having a plurality of sense amplifier circuits respectively associated with the columns of the plurality of memory cells for developing voltage levels indicative of data bits respectively read out from the columns of the plurality of memory cells, and driving one of the data bus sub-systems so as to allow the aforesaid one of the data bus subsystems to propagate accessed data bits selected from the data bits read out from the columns therealong; d) output data circuits coupled with the plurality of data bus subsystems, and responsive to the accessed data bits on the aforesaid one of the data bus sub-systems for producing an output data signal; e) an addressing means for selecting the accessed data bits from the plurality of data bits; and f) a data line selecting means coupled with the plurality of data bus sub-systems, and operative to cause the output data circuits to be irresponsive to voltage levels on the other of the plurality of data bus sub-systems.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
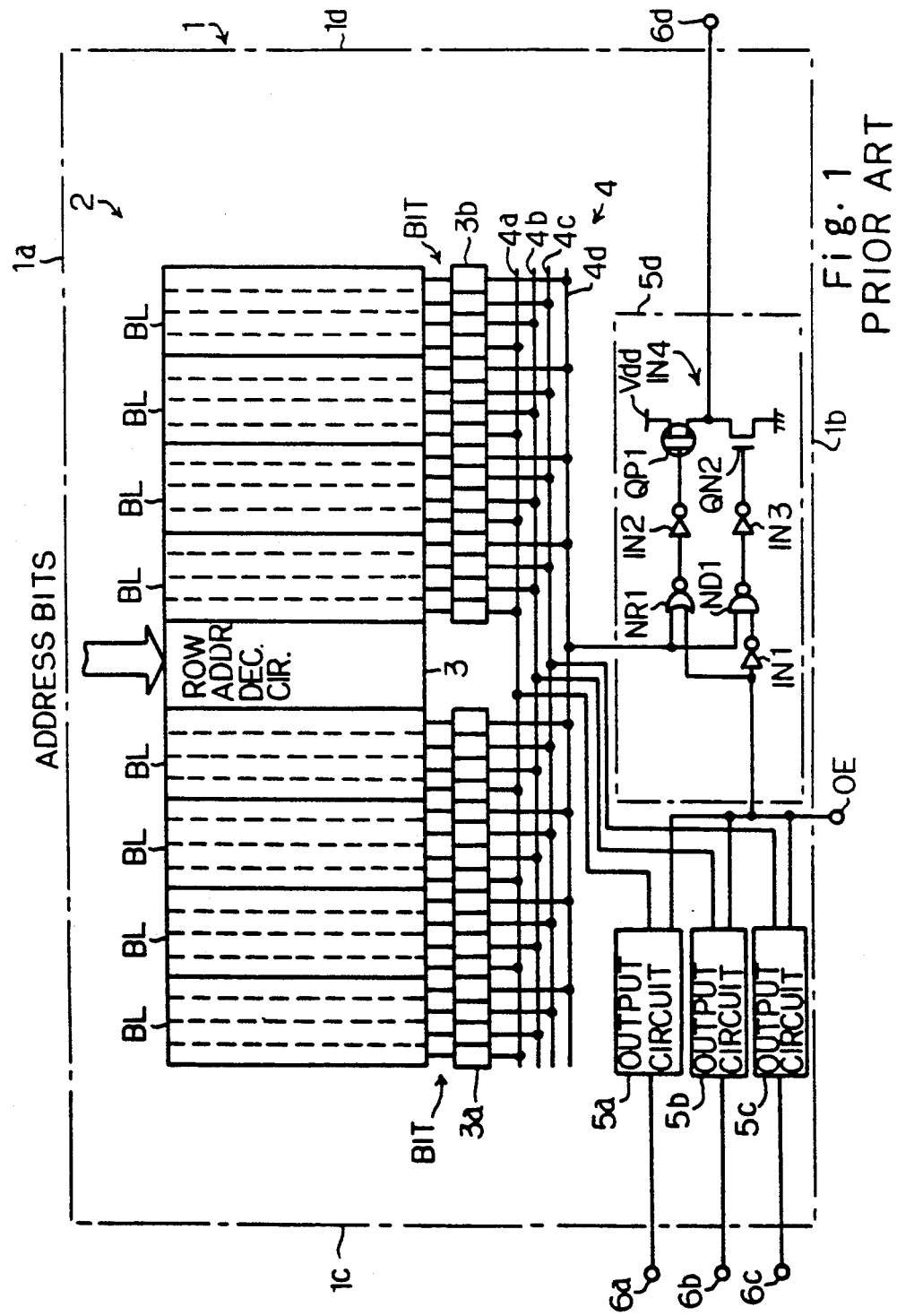
FIG. 1 is a block diagram showing the arrangement of the essential part of the prior art semiconductor memory device.
Figure 2:
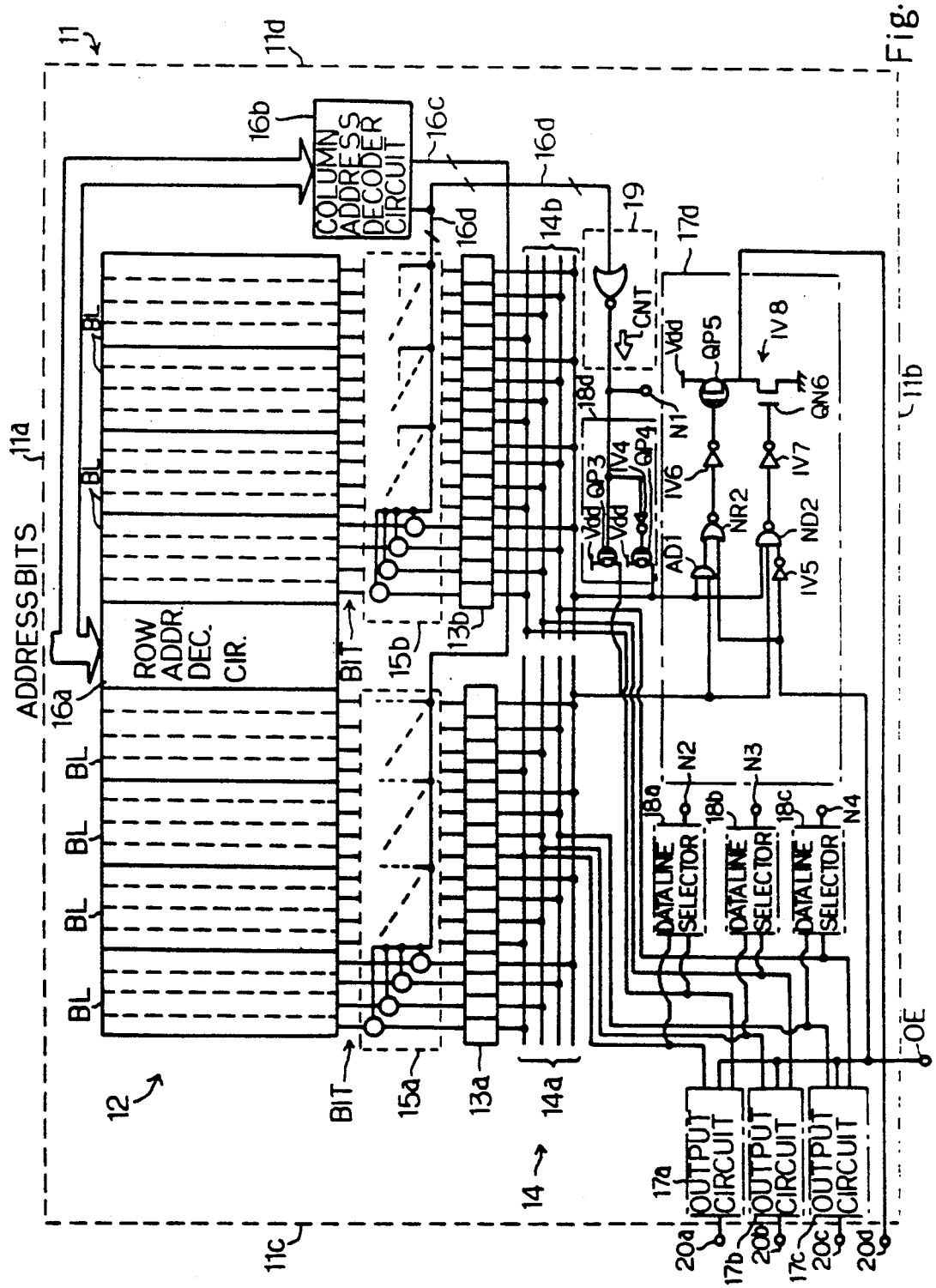
FIG. 2 is a block diagram showing the arrangement of an essential part of a semiconductor memory device according to the present invention.

Referring to FIG. 2 of the drawings, a semiconductor memory device embodying the present invention is fabricated on a rectangular semiconductor chip 11, and the semiconductor memory device implementing the first embodiment is of the static random access memory device. The rectangular semiconductor chip 11 has lateral edges 11a and 11b longer than side edges 11c and 11d as similar to the prior art semiconductor memory device, and the semiconductor memory device 11 comprises a memory cell array 12. The memory cell array 12 is constituted by a plurality of memory cells arranged in rows and columns, and digit lines BIT are associated with the columns of memory cells for propagating data bits read out therefrom. Every four columns of memory cells form in combination a memory cell block BL, and the memory cell blocks BL are grouped into the right sub-array and the left sub-array.

A row address decoder circuit 16a is provided between the left sub-array and the right sub-array, and responsive to row address bits for selecting a row of the memory cells from the left sub-array as well as a row of the memory cells from the right sub-array. When the rows of the memory cells are selected from the right sub-array and the left sub-array, data bits are read out to the associated digit lines BIT, and the digit lines BIT propagate the read-out data bits to transfer gate arrays 15a and 15b. In FIG. 2, small bubbles stand for the transfer gates of the arrays 15a and 15b, and one of the decoded signal lines 16c and 16d of a column address decoder circuit 16b allows four transfer gates to concurrently turn on, leaving the other transfer gates in the off-state.

Two sense amplifier circuit arrays 13a and 13b are respectively associated with the left and right memory cell sub-arrays, and the sense amplifier circuits of the circuit arrays 13a and 13b are respectively provided for the columns of memory cells. The digit lines BIT are selectively coupled through the transfer gate arrays 15a and 15b with the sense amplifier circuits of the arrays 15a and 15b so that logic levels of the selected read-out data bits are quickly discriminated by the sense amplifier circuits. Every four sense amplifier circuits form a sense amplifier circuit group, and every sense amplifier circuit group is associated with one of the memory cell blocks BL.

A read data bus system 14 consisting of four read-out data lines is divided into two read data bus sub-system 14a and 14b, and the read data bus sub-systems 14a and 14b are associated with the sense amplifier circuit arrays 13a and 13b and, accordingly, with the left and right sub-arrays. The sense amplifier circuit groups of the array 13a share the read data bus sub-system 14a, and the four sense amplifier circuits of each group respectively drive read-out data lines of the read data bus sub-system 14a. For this reason, the four read-out data bits discriminated by one of the sense amplifier circuit groups of the array 13a are propagated along the read data bus sub-system 14a. Similarly, the sense amplifier circuit groups of the array 13b share the read data bus sub-system 14b, and the four sense amplifier circuits of each group respectively drive read-out data lines of the read data bus sub-system 14b. For this reason, the four read-out data bits discriminated by one of the sense amplifier circuit groups of the array 13b are propagated along the read data bus sub-system 14b. As described hereinbefore, since the decoded signal lines 16c and 16d allows the transfer gate arrays 15a and 15b to couple one of the memory cell blocks BL with one of the sense amplifier circuit groups, the selected sense amplifier circuit group drives the associated read data bus sub-system 14a or 14b so that the accessed data bits are transferred from the digit lines BIT to the associated read data bus sub-system 14a or 14b. The read data bus system 14 extends along the lateral edges 11a and 11b, and the read data sub-system 14a is electrically isolated from the other read data bus sub-system 14b.

The read-out data lines of the sub-system 14a are respectively coupled with four output circuits 17a, 17b, 17c and 17d, and the read-out data lines of the other subsystem 14b are also coupled with the output circuits 17a to 17d. The read-out data lines of the bus sub-system 14a are respectively paired with the read-out data lines of the other bus sub-system 14b, and four data line pairs are further coupled with four data line selector circuits 18a, 18b, 18c and 18d, respectively. The data line selector circuits 18a to 18d are similar in circuit arrangement to one another, and each of the data line selectors 18a to 18d comprises two p-channel enhancement type charging transistors QP3 and QP4 coupled between a power voltage source Vdd and the data lines of the associated data line pair, and an inverter IV4 provided for the p-channel enhancement type charging transistor QP4. The data line selector circuits 18a to 18d are under the control of a controlling circuit 19 implemented by a NOR gate, and the NOR gate is coupled with the decoded signal lines 16d. The output node of the controlling circuit 19 is coupled with the gate electrode of the p-channel enhancement type charging transistors QP3 and the inverters IV4 of the data line selector circuits 18a to 18d, and a node labeled with N1 distributes a control signal CNT to nodes N2, N3 and N4. If one of the transfer gate groups of the array 15b relays accessed data bits through the associated sense amplifier circuit group to the read data bus sub-system 14b, one of the decoded signal lines 16d goes up to the high voltage level corresponding to logic "1" level, and the controlling circuit 18 produces the control signal CNT of logic "0" level or the low voltage level. Then, the p-channel enhancement type charging transistors QP3 turn on so as to charge the read-out data lines of the bus sub-system 14a, and the other p-channel enhancement type charging transistors QP4 remain off so that the read-out data lines of the bus sub-system 14b propagate the accessed data bits to the output circuits 17a to 17d. On the other hand, if the accessed data bits are transferred from the transfer gate array 15a through the sense amplifier circuit group to the read-out data lines of the bus sub-system 14a, all of the decoded signal lines 16d remain in logic "0" level, and the controlling circuit 19 produces the control signal CNT of logic "1" level or the high voltage level. Then, the inverters IV4 allow the p-channel enhancement type charging transistors QP4 to turn on, and the read-out data lines of the bus sub-system 14b are charged to the high voltage level. However, the read-out data lines of the bus sub-system 14a are isolated from the power voltage line Vdd, and can propagate the accessed data bits to the output circuits 17a to 17d.

The output circuits 17a to 17d respectively drive the output data pins 20a, 20b, 20c and 20d, and are concurrently enabled with an output enable signal OE of active low voltage level. The output circuits 17a to 17d are similar in circuit arrangement to one another, and each of the output circuits 20a to 20d comprises three inverters IV5, IV6, and IV7 an AND gate AD1, a NOR gate NR2, a NAND gate ND2 and an output driver IV8 implemented by a series combination of a p-channel enhancement type switching transistor QP5 and an n-channel enhancement type switching transistor QN6. The output driver IV8 is coupled between the power voltage source Vdd and a ground voltage line, and the associated data pin 20a, 20b, 20c or 20d is coupled with the common drain node of the p-channel enhancement type switching transistor QP5 and the n-channel enhancement type switching transistor QN6. The associated read data line pair is coupled with the input nodes of the AND gate AD1 and with the input nodes of the NAND gate ND2, and the output enable signal OE is applied to the input node of the NOR gate NR2 and the inverter IV5. The output node of the inverter IV5 is coupled with one of the input nodes of the NAND gate ND2. The output node of the NOR gate NR2 and the output node of the NAND gate ND2 are respectively coupled with the input nodes of the inverters IV6 and IV7, and the inverters IV6 and IV7 cause the p-channel enhancement type switching transistor QP5 and the n-channel enhancement type switching transistor QN6 to complementarily turn on and off.

In this instance, the addressing means is implemented by the row address decoder circuit 16a and the column address decoder circuit 16b, and the data line selector circuits 18a to 18d and the controlling circuit 19 as a whole constitute a data line selecting means. The inverters IV4 of the individual data line selector circuits 18a to 18d serve as respective decoder circuit, and the p-channel enhancement type charging transistors QP3 and QP4 of each data line selector circuit form in combination a charging circuit.

Description is hereinbelow made on the circuit behavior of the semiconductor memory device. Assuming now that address bits are indicative of the address assigned to a row of the memory cells in the leftmost memory cell block BL, the row address decoder circuit allows data bits to be read out from rows of the memory cells of the individual memory cell blocks BL. The read-out data bits are propagated to the transfer gate arrays 15a and 15b, and the column address decoder circuit 16b shifts one of the decoded signal lines 16c to the active high voltage level. However, all of the decoded signal lines 16d remain in the inactive low voltage level. Then, the transfer gate group associated with the leftmost memory cell block BL turns on to couple the leftmost memory cell block with associated sense amplifier group of the array 13a, and the sense amplifier circuits drives the read-out data lines of the data bus sub-system 14a. As a result, the accessed data bits are propagated along the data bus-system 14a to the output circuits 17a to 17d. Since the read data bus system 14 is divided into two bus sub-systems 14a and 14b, parasitic capacitance coupled thereto is decreased to a half of the parasitic capacitance coupled with the prior art read data bus system, and, for this reason, the sense amplifier circuits drive the read-out data lines at higher speed than the prior art.

With the decoded signal lines 16d of the low voltage level corresponding to logic "0" level, the controlling circuit 19 produces the control signal CNT of logic "1" level corresponding to the active high voltage level, and the control signal CNT is distributed to the data line selector circuits 18a to 18d. With the control signal CNT of the high voltage level, the inverters IV4 allow the p-channel enhancement type charging transistors QP4 to concurrently turn on, and the read data lines of the data bus sub-array 14b are charged to the power voltage level Vdd. However, the other p-channel enhancement type charging transistors QP3 remain off, and the accessed data bits are propagated to the output circuits 17a to 17d, respectively, without any turbulence.

If the accessed data bits are logic "1" level, the NOR gate NR2 and the NAND gate ND2 have been already enabled with the output enable signal OE of the active low voltage level corresponding to logic "0" level and the complementary output enable signal, and the AND gate AD1 transfers the accessed data bits of logic "1" level to the NOR gates NR2, respectively. The NOR gates NR2 produce the output signals of logic "0" level, and, accordingly, the inverters IV6 supply the output signals of logic "1" level corresponding to the high voltage level to the p-channel enhancement type switching transistor QP5. Then, the p-channel enhancement type switching transistors QP5 to turn off. On the other hand, the NAND gates, ND2 produces the output signal of logic "0" level, and the inverters IV7 supply the output signals of logic "1" level corresponding to the high voltage level to the n-channel enhancement type switching transistors QN6. Then, the n-channel enhancement type switching transistors QN6 turn on, and the output data pins 20a to 20d are driven to the high voltage level corresponding to logic "1" level. Thus, the complementary accessed data bits are applied to the output data pins 20a to 20d. However, inverters may be respectively coupled between the output drivers IV8 and the output data pins 20a to 20d.

If the accessed data bits are logic "0" level corresponding to the low voltage level, the AND gate AD1 supplies the output signals of logic "0" level to the NOR gates NR2. With the output signals of logic "0" level and the output enable signal OE of logic "0" level, the NOR gates NR2 yield the output signals of logic "1" level. As a result, the inverters IV6 supply the output signals of logic "0" level corresponding to the low voltage level to the p-channel enhancement type switching transistors QP5, and the p-channel enhancement type switching transistors QP5 turn on to drive the output data pins 20a to 20d to the high voltage level or logic "1" level. On the other hand, the NAND gates ND2 yield the output signals of logic "1" level, and the inverters IV7 supply the output signals of logic "0" level or the low voltage level to the n-channel enhancement type switching transistors QN6. As a result, the n-channel enhancement type switching transistors QN6 are turned off, and allows the high voltage level to be propagated to the output data pins 20a to 20d.

Assuming now that each read data line is 15000 microns in length and 1 micron in width and that adjacent two read data lines are spaced by 1 micron, parasitic capacitance of 0.2 pF is coupled with a unit length of 1 micron. If each read data line is 100 milli-ohms per the unit length, the total capacitance is 3 pF, and the total resistance is 1500 ohms. The time constant T is given as follows.

$$T = 3(pF) \times 1500(ohms) = 4.5(nanoseconds)$$

If each read data line is split into halves, the parasitic capacitance is decreased to ½, and the resistance is also decreased to ½. As a result, the time constant is decreased to a quarter, and is as small as 1.13 nanoseconds. Thus, the split read data bus system 14 improves the access speed.

As will be understood from the foregoing description, the sense amplifier circuits of the semiconductor memory device according to the present invention drive relatively small amount of parasitic capacitances, and the data access speed is improved.

Second Embodiment

Figure 3:
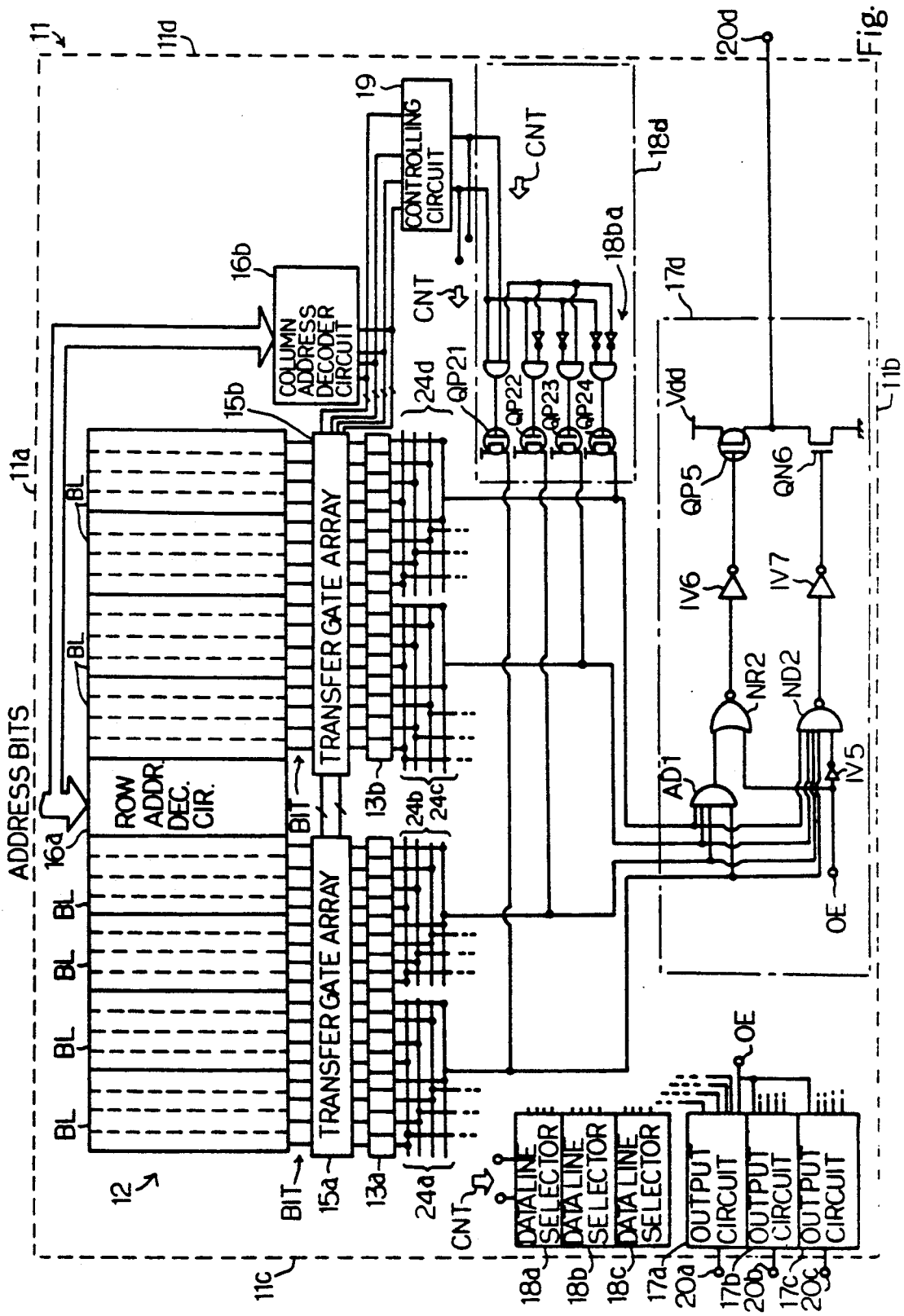
FIG. 3 is a block diagram showing the arrangement of an essential part of another semiconductor memory device according to the present invention.

Turning to FIG. 3 of the drawings, another semiconductor memory device embodying the present invention is illustrated. The semiconductor memory device implementing the second embodiment is similar to the first embodiment except for a read data bus system 24 split into four data bus sub-systems 24a, 24b, 24c and 24d. The other component lines and circuits are labeled with the same references designating the corresponding lines and circuits of the first embodiment. In order to select one of the data sub-systems 24a to 24d, the controlling circuit 19 produces the control signal CNT from the decoded signals of the column address decoder circuit 16b. The control signal CNT is decoded by decoders 18ba, and the data line selector circuits 18a to 18d selectively charge the bus sub-systems 24a to 24d through p-channel enhancement type charging transistors QP21, QP22, QP23 and QP24. Namely, one of the data bus sub-systems 24a to 24d propagates accessed data bits to the output circuits 17a to 17d, and the other of the data bus sub-systems 24a to 24d are charged to the power voltage level Vdd.

The parasitic capacitance driven by a sense amplifier circuit group is decreased to a quarter of the prior art, and the data access speed is further improved.

Although particular embodiments of the present invention have been shown and described, it will be obvious to those skilled in the art that various changes and modifications may be made without departing from the spirit and scope of the present invention. For example, a memory cell array may be divided into more than two memory cell sub-arrays, and, accordingly, a read data bus system may also divided into more than two read bus sub-systems. In this instance, the parasitic capacitance coupled with each read bus sub-system is further reduced, and data bits are accessed at higher speed.

What is claimed is:

1. A semiconductor memory device fabricated on a semiconductor chip, comprising:
   a) a memory cell array having a plurality of memory cells arranged in rows and columns, and storing data bits in said plurality of memory cells, respectively;
   b) a data bus system divided into a plurality of data bus sub-systems electrically isolated from one another, said data bus sub-systems being respectively implemented by a plurality sets of data lines;
   c) a sense amplifier unit having a plurality of sense amplifier circuits respectively associated with the columns of said plurality of memory cells for developing voltage levels indicative of data bits respectively read out from the columns of said plurality of memory cells, and driving one of said data bus sub-systems so as to allow said one of said data bus sub-systems to propagate accessed data bits selected from said data bits read out from said columns therealong;
   d) output data circuits coupled with said plurality of data bus sub-systems, and responsive to said accessed data bits on said one of said data bus sub-systems for producing an output data signal;
   e) an addressing means for selecting said accessed data bits from said plurality of data bits; and
   f) a data line selecting means coupled with said plurality of data bus sub-systems, and operative to cause said output data circuits to be irresponsive to voltage levels on the other of said plurality of data bus sub-systems, said data line selecting means comprising f-1) a controlling circuit for producing a control signal indicative of said one of said plurality of data bus sub-systems, and f-2) a plurality of data line selecting circuits each coupled with data lines respectively selected from said plurality sets of data lines, wherein each of said plurality of data line selecting circuits comprises f-2-1) a decoder responsive to said control signal for producing a decoded signal indicative of one of said data lines incorporated in said one of said plurality of data bus sub-systems, and f-2-2) a charging circuit responsive to said decoded signal for coupling the other data lines with a constant voltage source, said one of said data lines indicated by said decoded signal being isolated from said constant voltage source.

2. A semiconductor memory device as set forth in claim 1, in which said charging circuit comprises a plurality of charging transistors associated with said data lines, respectively, and coupled between said constant voltage source and said associated data lines.

* * * * *